(12) United States Patent
Rastegar et al.

(10) Patent No.: US 8,097,091 B2
(45) Date of Patent: Jan. 17, 2012

(54) HOT SOURCE CLEANING SYSTEM

(75) Inventors: Abbas Rastegar, Schenectady, NY (US); Andy Ma, Fremont, CA (US); Dave Krick, Port Matilda, PA (US); Pat Marmillion, Austin, TX (US)

(73) Assignee: NXP B.V., Eindhoven (NL)

( * ) Notice: Subject to any disclaimer, the term of this patent is extended or adjusted under 35 U.S.C. 154(b) by 787 days.

(21) Appl. No.: 11/574,231

(22) PCT Filed: Aug. 23, 2005

(86) PCT No.: PCT/IB2005/052763
§ 371 (c)(1),
(2), (4) Date: Sep. 27, 2007

(87) PCT Pub. No.: WO2006/021927
PCT Pub. Date: Mar. 2, 2006

(65) Prior Publication Data
US 2008/0264446 A1    Oct. 30, 2008

Related U.S. Application Data

(60) Provisional application No. 60/603,915, filed on Aug. 23, 2004.

(51) Int. Cl.
*B08B 3/02* (2006.01)
*B08B 3/04* (2006.01)
*B08B 3/10* (2006.01)

(52) U.S. Cl. .............. 134/19; 134/1; 134/1.3; 134/26; 134/30; 134/95.2; 134/105

(58) Field of Classification Search ............ 134/64, 134/95.2, 105 R, 1, 1.3, 19; 156/345.51
See application file for complete search history.

(56) References Cited

U.S. PATENT DOCUMENTS

| 4,240,453 A | * | 12/1980 | Vial et al. ............... 134/107 |
| 4,311,427 A | * | 1/1982 | Coad et al. ............. 414/217 |
| 4,693,777 A | * | 9/1987 | Hazano et al. .......... 156/345.31 |

(Continued)

FOREIGN PATENT DOCUMENTS

JP        09148297 A    *    6/1997

(Continued)

OTHER PUBLICATIONS

English translation of JP 10-189532, Takeda et al.; 1998.*

(Continued)

*Primary Examiner* — Michael Kornakov
*Assistant Examiner* — Natasha Campbell

(57) ABSTRACT

There is an apparatus for cleaning a substrate (5) mounted on a moveable platen. In an example embodiment, the apparatus comprises a first chamber (20), the first chamber has solvent-dispensing nozzles (25); the solvent-dispensing nozzles wet the substrate surface (5) with a solvent (7) as the platen transports the substrate. The platen moves in a predetermined direction and at a predetermined scan velocity as it transports the substrate into a process chamber. The process chamber has a hot source (30) at a predetermined height (h) from the substrate surface (5); it provides heat energy directed toward the substrate surface, the heat energy evaporates the solvent (7) dispensed on the substrate surface; the solvent evaporation removes particulates (35) from the substrate surface, as the platen transports the substrate from the first chamber (20) into the process chamber. Substrates cleaned may include precision photo-masks, or wafers.

18 Claims, 2 Drawing Sheets

U.S. PATENT DOCUMENTS

Figure 1:
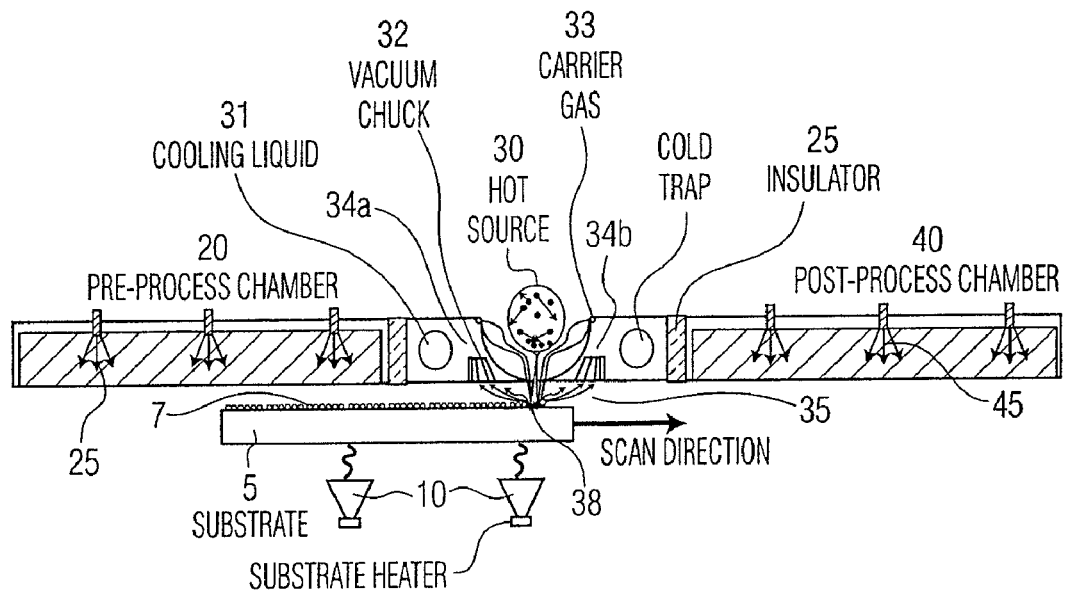

| | | | |
|---|---|---|---|
| 5,246,501 A * | 9/1993 | Rodgers et al. | 134/10 |
| 5,565,034 A * | 10/1996 | Nanbu et al. | 118/668 |
| 2003/0045098 A1 * | 3/2003 | Verhaverbeke et al. | 438/689 |
| 2004/0020898 A1 | 2/2004 | Uziel | |
| 2004/0045575 A1 | 3/2004 | Kinoshita et al. | |

FOREIGN PATENT DOCUMENTS

| | | | |
|---|---|---|---|
| JP | 09148297 A | | 10/1997 |
| JP | 10189532 A | * | 7/1998 |
| JP | 10189532 A1 | | 10/1998 |

OTHER PUBLICATIONS

English translation of JP 09-148297, Kikuchi et al.; 1997.*
WIPO, International Search Report & Written Opinion of International Searching Authority. Mailing Date: Feb. 6, 2006.

* cited by examiner

HOT SOURCE CLEANING SYSTEM

The present invention relates the processing semiconductors. More particularly, the present invention relates to the removal of sub-micron particles during the cleaning of a substrate.

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per area of the silicon wafer increases, the manufacturing process becomes more difficult.

Many varieties of semiconductor devices are manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and the drain regions. In bipolar transistors, an active device generally includes emitter and collector regions and a base electrode to control operation of the transistor.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features to be printed on the substrate. After exposure, the resist-coated wafer substrate is developed. The desired features as defined on the mask are retained on the photo resist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

Often desired features have particular regions in which the final printed and etched regions have to be accurately reproduced over time. These are referred to as critical dimensions (CDs). As device geometry approaches the sub-micron realm, wafer fabrication becomes more reliant on maintaining consistent CDs over normal process variations. The active device dimensions as designed and replicated on the photo mask and those actually rendered on the wafer substrate have to be repeatable and controllable. In many situations, the process attempts to maintain the final CDs equal to the masking CDs.

As the CDs are trending smaller in the advancing of the technology, the adequate cleaning of the mask plates becomes critical. Any particles present on the surface of the mask plate may be imaged as an undesirable feature on the silicon substrate, resulting in a defect. Too many defects cause device failure and lower yield. The size of such particles is trending into the submicron realm, about 100 nm or less.

Removal of sub 100 nm particles from a surface is a challenging subject of today's surface preparation research. The surface-particle interactions depend on detail surface structure of the materials involved and generally are size independent. However, the energy transfer efficiency to a particle on a surface strongly depends on the size of the particle on the surface. To remove a particle from a surface one firstly, has to overcome the adhesive forces between the particle and the surface and secondly, transport the particle far from the surface in a safe distance over which the particle is not re-deposited on the surface.

Next generation semiconductor technology uses reflective optics, which requires extremely flat surfaces with an average roughness of 1.5 Angstrom RMS. Hence, the conventional wet cleaning techniques that use the under etching of a particle to remove it from the surface no longer are applicable.

For sub-100 nm particle removal, one should use a physical mechanism in addition to chemical techniques to separate the particle from the surface. There are different techniques that offer some kind of physical interactions between an energy source and the particle.

Among them is the laser cleaning technique, which uses laser interaction with the particle to remove it from the surface. Liquid-assisted laser cleaning is a technique that uses sudden evaporation of a liquid (water) on the surface under exposure to laser pulses. Laser cleaning poses a risk of damage to the substrate. This is due to power dissipation in a concentrated area in the substrate. Some laser cleaning technique shortcomings include that high-density power is focused at a point and the power transfer to the substrate is not readily controllable. Further information may be found in U.S. Pat. No. 6,494,217 (issued Dec. 17, 2002) of Thompson et al. titled, "Laser Cleaning Process for Semiconductor Material and the Like," incorporated by reference in its entirety.

There exists a need for a technique that can overcome the challenges encountered with liquid-assisted laser cleaning.

The present invention has been found useful in the cleaning of substrates, such as photo masks. A hot source is adapted to vaporize the water (nano) droplets present on the surface. The sudden evaporation of the water molecules at the surface will lead to lateral energy transfer to the undesirable particles that have adhered to the surface. This momentum can separate these particles from the surface.

In an example embodiment according to the present invention, there is an apparatus for cleaning a substrate mounted on a moveable platen. The apparatus comprises a first chamber, the first chamber having solvent-dispensing nozzles. The solvent-dispensing nozzles wet the substrate surface with a solvent as the platen transports the substrate. The platen moves in a predetermined direction and at a predetermined scan velocity. The platen transports the substrate from the first chamber into a process chamber, having a hot source at a predetermined height from the substrate surface, providing heat energy directed toward the substrate surface, the heat energy evaporating the solvent dispensed on the substrate surface, the solvent evaporation removing particulates from the substrate surface, as the platen transports the substrate from the first chamber into the process chamber. A feature of this embodiment, further comprises a second chamber. The second chamber has solvent-dispensing nozzles re-wetting the substrate surface with the solvent, as the platen transports the substrate from the process chamber into the second chamber. The solvent-dispensing nozzles may dispense a variety of solvents depending upon the substrate to be cleaned. Solvents may be selected from but not limited to, water, detergent, an organic solvent, liquid carbon dioxide, and liquid nitrogen. Another feature of this embodiment further comprises a substrate heater to raise the temperature of the substrate to predetermined temperature below an evaporation temperature of the solvent in the process chamber.

In another example embodiment according to the present invention, there is an apparatus for cleaning a substrate mounted on a moveable platen. The apparatus comprises a first chamber, the first chamber having solvent-dispensing nozzles. The solvent-dispensing nozzles wet the substrate surface with a solvent as the platen transports the substrate. The platen moves in a predetermined direction and at a predetermined scan velocity. The platen transports the substrate from the first chamber into a process chamber, having a hot source at a predetermined height from the substrate surface, providing heat energy directed toward the substrate surface, the heat energy evaporating the solvent dispensed on the substrate surface, the solvent evaporation removing particulates from the substrate surface, as the platen transports the substrate from the first chamber into the process chamber. There is a second chamber that has solvent-dispensing nozzles re-wetting the substrate surface with the solvent, as the platen transports the substrate from the process chamber into the second chamber.

In yet another example embodiment, there is a system for cleaning a substrate surface. The system comprises, a means for placing the substrate in a first chamber. In the first chamber, there are means for depositing atomized water droplets on the substrate surface. After depositing the atomized water droplets, there are means for transporting the substrate to a process chamber. Within the process chamber, there are means for exposing the substrate to a hot source; the hot source evaporates the water deposited on the substrate surface, the water evaporation removing particulates form the substrate surface. Means for carrying the particulates away from the substrate surface prevent the re-deposition of the particulates on the substrate surface. Additional features of the embodiment further comprise, means for making a determination of whether the substrate surface is sufficiently clean. If the determination shows the substrate surface is not sufficiently clean, there are means for transporting the substrate to a second chamber depositing atomized water droplets on the substrate surface and means for transporting the substrate back to the process chamber to re-expose the substrate surface to the hot source. If the determination shows the substrate surface is sufficiently clean, there is a means for showing an end-of-clean indication.

In yet another example embodiment, there is a method for cleaning a substrate. The method comprises, placing the substrate in a first chamber and depositing atomized water droplets on the substrate surface. The substrate is transported to a process chamber and the substrate is exposed to a hot source, the hot source evaporates the water deposited on the substrate surface, the wafer evaporation removing particulates from the substrate surface and carrying the particulates away from the substrate surface. The substrate is transported to a second chamber and atomized water droplets are deposited on the substrate surface. Additional features of the method further comprise, making a determination of whether the substrate surface is clean and if clean, moving the substrate to a dryer. If the substrate surface is not clean, the substrate is transported back to the process chamber, and re-exposed to the hot source, the hot source evaporating the water deposited on the substrate surface. The water evaporation removes particulates from the substrate surface and carries the particulates away from the substrate surface. The substrate is transported back to the first chamber or the second chamber and atomized water droplets are re-deposited on the substrate surface. The determination of whether the substrate is clean is repeated. The above summaries of the present invention are not intended to represent each disclosed embodiment, or every aspect, of the present invention. Other aspects and example embodiments are provided in the figures and the detailed description that follow.

Figure 2:
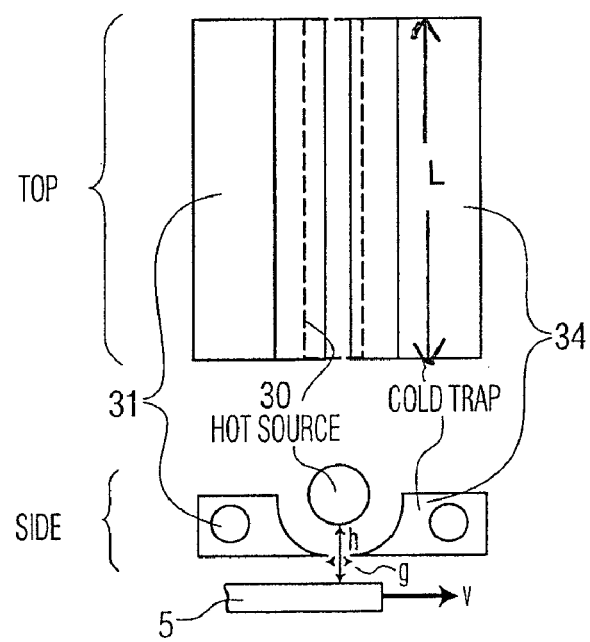
Figure 3:
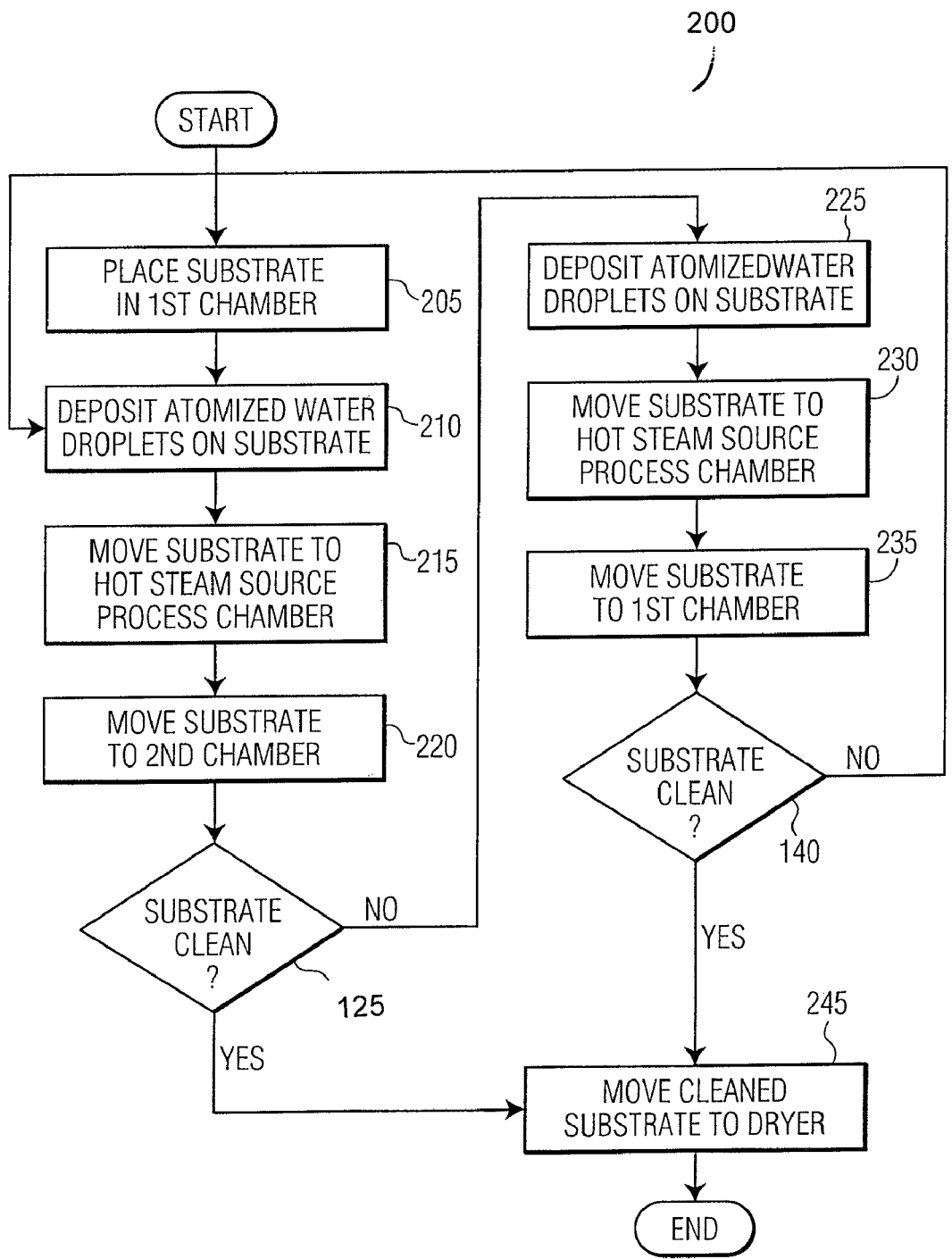

The invention may be more completely understood in consideration of the following detailed description of various embodiments of the invention in connection with the accompanying drawings, in which:

FIG. 1 is a side view of an apparatus for removing particles from a substrate according to an embodiment of the present invention; and FIG. 2 is a top view and close-up side view of the heat source of the apparatus shown in FIG. 1; and FIG. 3 is a flowchart of the particle removal process a substrate undergoes according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims The present invention has been found useful removing sub 100 nm particles from substrates, in particular precision glass substrates such as those used in photo masks. It is important to render those features on the photo mask that are desired, to the silicon substrate. Contaminants such as dust particles, such as those which a photo mask may encounter in normal use and handling or chrome which had not etched in the photo mask's manufacture, results in the printing undesired features on the silicon substrate. In removing the sub-100 nm particles, the forces the bind the particles to the substrate's surface have to be overcome.

In an example embodiment according to the present invention, there is a hot source cleaning system (HSCS). Refer to FIG. 1. The HSCS includes a first (pre-process) chamber 20 and a second (post process) chamber 40, two cold traps (34, 36), and a process chamber 35 having a hot source 30. To isolate the first chamber 20 and second chamber 40 from the heat of process chamber 35, an insulator material 25 is included.

Substrate 5 enters in the pre-process chamber 20. The substrate 5 is carried by a platen (not illustrated); the platen transports the substrate between the first chamber 20, process chamber 35 and second chamber 40. The pre-process chamber 20 has nozzles 25 that produce very small water vapor droplets 7 (i.e., an atomizer). The water droplets are deposited on the substrate surface 5. The shape of the droplet depends (i.e. contact angle) on the surface properties whether the surface is hydrophilic or hydrophobic. The substrate 5 then moved under a hot steam source 30 that blows hot steam on the substrate surface 5. As the steam temperature may be much more than the boiling temperature of water, the hot steam instantly vaporizes the water droplets 7 along the length of the substrate. This sudden evaporation releases enough energy on the substrate surface 5 and transfers momentum to the particles that adhere to the substrate surface 5. These particles 38 will be dislodged from the substrate surface 5 and some of them leave the surface with hot vapor. With a vacuum chuck 32 and a carrier gas 33, the dislodged particles are taken away from the substrate. The carrier gas may be nitrogen ($N_2$) or argon (Ar) carbon dioxide ($CO_2$) or other suitable inert gas. Furthermore, cold traps 34a, 34b adjacent to the particles collect any water vapor that may redeposit onto the substrate 5. Coolant 31 circulates through the cold traps 34a, 34b to maintain a steady cool temperature.

The substrate 5 is transferred to the second (post-process) chamber 40 from the process chamber 35. Within the second chamber 40, water droplets are again deposited onto the substrate through nozzles 45. The substrate 5 is moved back to the hot source 30 in the process chamber 35 for additional particle removal. If more particle removal is desired, the substrate 5 is transferred back to the first chamber 20 where additional water droplets are deposited. Transfer between the first chamber 20 through the process chamber 35 and second chamber 40 may be repeated until the substrate is sufficiently clean per predetermined process requirements.

Having been sufficiently clean, the wet substrate 5 is sent to an IPA dryer (e.g., isopropyl alcohol dryer). After drying, the substrate may be placed in contamination resistant packaging for later processing or use.

In another embodiment according to the present invention, the drying apparatus may use heaters 10 (e.g. lamp, resistive) to heat the substrate 5. The heater slowly raises the temperature to a value about 10° C. to 20° C. below evaporation temperature of water. As the temperature of substrate 5 is more than surroundings, thermo-phoretic forces reduce particle re-deposition on the surface. In addition, less energy to evaporate a water droplet on the surface is required.

In yet another embodiment, in lieu of hot steam, the hot source 30 can radiate dry heat that may be directed to the substrate 5. Refer to FIG. 2. The figure shows the detail mechanism of heat focusing and the involved parameters. Hot source 30 radiates heat that passes through a rectangular aperture with width (G). The length (L) of the aperture is predetermined by the width of the substrate 5 processed through the apparatus. The scattering of the heat from the aperture edge can be used as a Fresnel diffraction lens. Total energy transfer to substrate surface 5 can be controlled by the gap distance G. The additional heat will be adsorbed by the upper surface of the cold trap.

The substrate scan velocity (V) can be used to control the total energy transferred to the unit area of the substrate surface. Therefore, by controlling the total radiation power of the source, gap distance G and substrate scan velocity V, one can get optimum energy to instantly evaporate the water droplet on the surface and yet do not heat the substrate that may cause surface deformation defects.

In another example embodiment according to the present invention, the cleaning apparatus may be set up to go through the pre-programmed procedure. Refer to FIG. 3. A substrate undergoes a cleaning process 200. The substrate is placed in a first process chamber 205. Atomized water droplets are deposited onto the substrate 210. The substrate is moved to the hot steam source 215. Particulates are removed from the substrate. The substrate is moved to a second process chamber 220. Based on empirical evidence and other appropriate analysis, there is a standard of cleanliness required. The cleaning apparatus is programmed to determine whether the substrate is clean 125. If sufficiently clean 125, the cleaned substrate is moved to a dryer 245. If not, the substrate has additional atomize water droplets deposited thereon 225. The substrate is again moved to the hot steam source 230 and cleaned further. After cleaning, the substrate is moved back to the first process chamber 235. If the substrate is sufficiently clean 140, the cleaned substrate is moved to the dryer. If the substrate is not clean, the process continues with additional atomized water droplets applied to the substrate 210. The process continues until the substrate is sufficiently clean. For a quartz mask substrate temperature can be as high as 1000.degree. C. However, it is not desirable to expose a precision flat mask to such a high temperature. During cleaning it is preferred, to keep a temperature of the mask plate below a 100.degree. C. An example wet clean process can heat up the plates to about 110.degree. C.

In drying the mask substrate, in an example process may be to have a mask holder under post process chamber adapted to spin-dry the mask substrate. The drying process begins by the spinning plates under nozzles while ultra-pure water is sprayed on the mask surface. In the next step, water spray will stop while spinning continues. Spinning alone dries the plates. Furthermore, IPA may be mixed in after water spray to reduce surface tension to facilitate water removal. Spin-drying is well known in the art.

Through experimentation, the number of cycles needed to clean the substrate may be determined. Defect inspection tools would be needed to scan submicron particles remaining after cleaning. In an example manufacturing line, an inspection tool would be proximity to the cleaning apparatus so that the substrate may be inspected after a series of cleaning cycles.

In this technique, there are a number of parameters to adjust the power transferred to the substrate (G, h, v, Total power, Cooling rate). As most of these parameters technically can be easily controlled, a more controlled vertical heat profile may be achieved. These parameters may then be programmed into the equipment having a computer-controlled interface. The transmitted energy ($R_E$) is proportional with inverse of square of distance. $R_E \propto 1/h^2$ and the inverse of gap distance $R_E \propto 1/g$. Scan velocity determines energy radiated to the units of surface area. The faster the scan velocity, the larger the exposed area of the mask surface and therefore less energy transferred to the units of surface. A rough estimate is $R_E \propto 1/v_{scan}$. Specific parameters and coefficients would be derived from empirical data collected from a given apparatus set up to clean a particular substrate type. Through process development, the optimum process is derived.

In another example process according to the present invention, other solvents in addition to water may be used. These may include, but are not necessarily limited to, organic solvents, detergents, surfactants, liquid nitrogen, liquid $CO_2$. The type or condition of the substrate to be cleaned would govern the solvent selection. For example, one common case is functionalized water in which ozone ($O_3$), hydrogen ($H_2$), $CO_2$ and so on are dissolved in the water. Surfactants are also often is added to water to increase the effectiveness of the cleaning.

Although the aforementioned examples involved mask substrates, the invention may be applied to wafer substrates, mask substrates, or other precision substrates requiring the removal of microscopic particles. Furthermore, the invention may be used for both patterned and un-patterned substrates. Numerous other embodiments of the invention will be apparent to persons skilled in the art without departing from the spirit and scope of the invention as defined in the appended claims.

What is claimed is:

1. An apparatus for cleaning a substrate mounted on a moveable platen, the apparatus comprising:
    a first chamber the first chamber having solvent-dispensing nozzles the solvent-dispensing nozzles wetting the substrate surface with a solvent as the platen transports the substrate, the platen moving in a predetermined direction and at a predetermined scan velocity;

a process chamber, the process chamber having a hot source at a predetermined height from the substrate surface, providing heat energy directed toward the substrate surface, the heat energy evaporating the solvent dispensed on the substrate surface, the solvent evaporation removing particulates from the substrate surface, as the platen transports the substrate from the first chamber into the process chamber; and means for carrying the particulates away from the substrate surface, thereby preventing the particulates from re-depositing on the substrate surface.

2. The apparatus as recited in claim 1, further comprising, a second chamber the second chamber having solvent-dispensing nozzles the solvent-dispensing nozzles re-wetting the substrate surface with the solvent, as the platen transports the substrate from the process chamber into the second chamber.

3. The apparatus as recited in claim 1, wherein the solvent-dispensing nozzles dispense a solvent selected from at least one the following: water, detergent, an organic solvent, liquid carbon dioxide, liquid nitrogen.

4. The apparatus as recited in claim 1, the apparatus further comprising, a substrate heater, the substrate heater raising the temperature of the substrate to a predetermined temperature below an evaporation temperature of the solvent in the process chamber.

5. The apparatus as recited in claim 1, wherein the heat energy includes at least one of the following: dry heat, hot steam.

6. An apparatus for cleaning a substrate mounted on a movable platen, the apparatus comprising:

a first chamber having solvent-dispensing nozzles configured and arranged to wet the substrate surface with a solvent as the platen transports the substrate, the platen moving in a predetermined direction and at a predetermined scan velocity; and a process chamber having
a cold trap,
a vacuum chuck built into the cold trap,
a hot source at a predetermined height from the substrate surface, providing heat energy directed toward the substrate surface, the heat energy evaporating the solvent dispensed on the substrate surface, the solvent evaporation removing particulates from the substrate surface, as the platen transports the substrate from the first chamber into the process chamber, and
carrier gas orifices in the vicinity of the hot source wherein a carrier gas emanates from the orifices, removing the particulates carried by the solvent evaporated from the substrate surface with the hot source, the vacuum chuck capturing the particulates removed from the substrate surface.

7. The apparatus as recited in claim 6, wherein the carrier gas includes at least one of the following: nitrogen, argon, carbon dioxide.

8. The apparatus as recited in claim 6, wherein the hot source further includes, an aperture of a pre-determined gap distance (g) and length, the length of the aperture defined by the width of the substrate transported on the platen.

9. The apparatus as recited in claim 8, wherein energy transmitted to the substrate surface is a function of power of the hot source, the predetermined height (h) of the hot source from the substrate surface, the predetermined gap distance (g), and the pre-determined scan velocity (v).

10. The apparatus as recited in claim 9, wherein the energy transmitted to the substrate surface is adjusted to instantly evaporate a water droplet on the substrate surface without heating the substrate surface to a temperature sufficient to cause surface deformation.

11. The apparatus as recited in claim 9, further comprising, a scanner to determine a degree of cleanliness of the substrate, the scanner providing the apparatus an end of cleaning indication.

12. An apparatus for cleaning a substrate mounted on a moveable platen, the apparatus comprising:

a first chamber the first chamber having water-dispensing nozzles the water-dispensing nozzles wetting the substrate surface as the platen transports the substrate, the platen moving in a predetermined direction and at a predetermined scan velocity;

a process chamber, the process chamber having a hot source at a predetermined height from the substrate surface, providing heat energy directed toward the substrate surface, the heat energy evaporating the water dispensed on the substrate surface, the water evaporation removing particulates from the substrate surface, as the platen transports the substrate from the first chamber into the process chamber, and means for carrying the particulates away from the substrate surface, thereby preventing the particulates away from the substrate surface, thereby preventing the particulates from re-depositing on the substrate surface; and a second chamber the second chamber having water-dispensing nozzles, the water-dispensing nozzles re-wetting the substrate surface, as the platen transports the substrate from the process chamber into the second chamber.

13. An apparatus for cleaning a substrate mounted on a movable platen, the apparatus comprising:

a first chamber having water-dispensing nozzles configured and arranged to wet the substrate surface as the platen transports the substrate, the platen moving in a predetermined direction and at a predetermined scan velocity;

a process chamber having
a hot source at a predetermined height from the substrate surface and configured and arranged to provide heat energy directed toward the substrate surface, the heat energy evaporating the water dispensed on the substrate surface, the water evaporation removing particulates from the substrate surface, as the platen transports the substrate from the first chamber into the process chamber,
a cold trap,
a vacuum chuck built into the cold trap, and
carrier gas orifices in the vicinity of the hot source wherein a carrier gas emanates from the orifices, removing the particulates carried by the water evaporated from the substrate surface with the hot source, the vacuum chuck capturing the particulates removed from the substrate surface; and a second chamber having water-dispensing nozzles configured and arranged to re-wet the substrate surface as the platen transports the substrate from the process chamber into the second chamber.

14. System for cleaning a substrate surface, the system comprising, means for depositing atomized water droplets on the substrate surface in a first chamber;
means for transporting the substrate to a process chamber;

means for exposing the substrate to a hot source, the hot source evaporating the water deposited on the substrate surface the water evaporation removing particulates from the substrate surface; and means for carrying the particulates away from the substrate surface, thereby preventing re-depositing of the particulates on the substrate surface.

15. The system as recited in claim 14, further comprising, means for making a determination of whether the substrate surface is sufficiently clean;

if the determination shows the substrate surface is not clean, means for transporting the substrate to a second chamber depositing atomized water droplets on the substrate surface;

means for transporting the substrate back to the process chamber and re-exposing the substrate surface to the hot source.

16. A method for cleaning a substrate, the method comprising:

a) placing the substrate on a movable platen in a first chamber having water-dispensing nozzles, and wetting the substrate surface by depositing atomized water droplets on the substrate as the platen transports the substrate, the platen moving in a predetermined direction and at a predetermined scan velocity;

b) transporting the substrate to a process chamber and exposing the substrate to a hot source at a predetermined height from the substrate surface, providing heat energy directed toward the substrate surface, and using the heat energy for evaporating the water deposited on the substrate surface, the water evaporation removing particulates from the substrate surface as the platen transports the substrate from the first chamber into the process chamber, and carrying the particulates away from the substrate surface using a carrier gas emanating from orifices in the vicinity of the hot source, and capturing the particulates removed from the substrate surface using a cold trap having a vacuum chuck; and c) transporting the substrate to a second chamber having water-dispensing nozzles, and using the water-dispensing nozzles to rewet the substrate surface, as the platen transports the substrate from the process chamber into the second chamber, by depositing atomized water droplets on the substrate surface.

17. The method as recited in claim 16, further comprising, d) making a determination of whether the substrate surface is clean and if clean, moving the substrate to a dryer;

e) if not clean, transporting the substrate back to the process chamber and re-exposing the substrate to a hot source, the hot source evaporating the water deposited on the substrate surface, the water evaporation removing particulates from the substrate surface, and carrying the particulates away from the substrate surface;

f) transporting the substrate back to the first chamber or the second chamber re-depositing atomized water droplets on the substrate; and g) repeating step d).

18. The method as recited in claim 17, wherein the hot source provides energy from at least one of the following: dry heat, hot steam.

* * * * *